(12) United States Patent
Lee

(10) Patent No.: US 12,151,315 B2
(45) Date of Patent: Nov. 26, 2024

(54) DUAL-TYPE SOLDER BALL PLACEMENT SYSTEM

(71) Applicant: S.S.P. INC., Incheon (KR)

(72) Inventor: Kyouho Lee, Suwon-si (KR)

(73) Assignee: S.S.P. INC., Incheon (KR)

( * ) Notice: Subject to any disclaimer, the term of this patent is extended or adjusted under 35 U.S.C. 154(b) by 162 days.

(21) Appl. No.: 17/908,055

(22) PCT Filed: Jul. 1, 2020

(86) PCT No.: PCT/KR2020/008567
§ 371 (c)(1),
(2) Date: Oct. 4, 2022

(87) PCT Pub. No.: WO2021/246567
PCT Pub. Date: Dec. 9, 2021

(65) Prior Publication Data
US 2023/0088097 A1  Mar. 23, 2023

(30) Foreign Application Priority Data
Jun. 4, 2020 (KR) .......................... 10-2020-0067677

(51) Int. Cl.
*B23K 3/06* (2006.01)
*B23K 1/00* (2006.01)
*B23K 1/20* (2006.01)
*H01L 23/00* (2006.01)
(Continued)

(52) U.S. Cl.
CPC .......... *B23K 3/0623* (2013.01); *B23K 1/0016* (2013.01); *B23K 1/203* (2013.01); *H01L 24/742* (2013.01); *B23K 2101/40* (2018.08); *B23K 2101/42* (2018.08); *H01L 2224/742* (2013.01); *H01L 2924/35* (2013.01)

(58) Field of Classification Search
None
See application file for complete search history.

(56) References Cited

U.S. PATENT DOCUMENTS 6,412,680 B1 * 7/2002 Chua .................... H01L 21/4853
  228/9
2002/0170945 A1 * 11/2002 Shafie ................. H01L 21/4853
  228/103

(Continued)

FOREIGN PATENT DOCUMENTS

JP  2000-077447 A  3/2000
JP  2001-223234 A  8/2001
(Continued)

*Primary Examiner* — Devang R Patel
(74) *Attorney, Agent, or Firm* — Bridgeway IP Law Group, PLLC; Jihun Kim

(57) ABSTRACT

A dual-type solder ball placement system is capable of allowing solder balls of the same type or solder balls having two different types to be mounted simultaneously through two ball mounting lines, thereby efficiently mounting the solder balls arranged with various purposes and patterns. Specifically, the dual-type solder ball placement system allows solder balls serving as terminals and core balls serving as supports to be mounted simultaneously through an inline method, thereby preventing a wafer, a unit, a chipset, and the like that become lighter, thinner, shorter, and smaller from being bent.

5 Claims, 5 Drawing Sheets

(51) Int. Cl.
 *B23K 101/40* (2006.01)
 *B23K 101/42* (2006.01)

(56) References Cited

U.S. PATENT DOCUMENTS

| | | | | |
|---|---|---|---|---|
| 2010/0051671 | A1* | 3/2010 | Ling | B23K 3/0623 |
| | | | | 228/103 |
| 2012/0031954 | A1 | 2/2012 | Ling et al. | |
| 2014/0001241 | A1* | 1/2014 | Igarashi | B23K 3/082 |
| | | | | 228/9 |
| 2017/0129032 | A1* | 5/2017 | Kim | B23K 1/0016 |

FOREIGN PATENT DOCUMENTS

| | | | |
|---|---|---|---|
| KR | 10-2010-0054974 | A | 5/2010 |
| KR | 10-2017-0054055 | A1 | 5/2017 |
| KR | 10-2019-0075475 | A | 7/2019 |
| KR | 10-2020-0050073 | A | 5/2020 |
| KR | 10-2123485 | B1 | 6/2020 |
| KR | 10-2168405 | B1 | 10/2020 |
| WO | 2018/111263 | A1 | 6/2018 |

* cited by examiner

DUAL-TYPE SOLDER BALL PLACEMENT SYSTEM

TECHNICAL FIELD

The present invention relates to a dual-type solder ball placement system, and more specifically, to a dual-type solder ball placement system that is capable of allowing two ball mounting lines to operate cooperatively with each other, thereby mounting solder balls in various methods.

In specific, the present invention relates to a dual-type solder ball placement system that is capable of allowing solder balls of the same type or solder balls having two different types to be mounted simultaneously through two ball mounting lines, thereby efficiently mounting the solder balls arranged with various purposes and patterns.

BACKGROUND ART

Semiconductor technologies have been developed to improve the miniaturization and integration of devices, and as information technology (IT) devices become smaller, recently, low-power and high-performance chips capable of processing large capacity data have been introduced.

A flip chip as one of semiconductor chip packages made through such development in the semiconductor technologies is produced by directly attaching solder balls as bump balls made of solder to a wafer, not using a metal lead (wire), when a semiconductor unit called a die is mounted on the wafer, and accordingly, the flip chip is called a wireless semiconductor.

Like this, as the wafer becomes thinner and the number of input/output (I/O) terminals becomes increased, electronic devices have high performance and low power and become lighter, thinner, shorter, and smaller, and recently, wafer level chip scale package (WLCSP) technologies in which the solder balls as bump balls are directly attached to the wafer to make semiconductor packages have been developed. Like this, a system for attaching the solder balls to the wafer is called a solder ball placement system.

Further, the solder ball placement system is configured to have a ball tool adapted to attach (mount) solder balls onto a wafer, a unit, a chipset, and the like, and one of conventional ball tools is disclosed in Korean Patent Application Laid-open No. 10-2017-0054055 entitled 'Ball box and solder ball attaching device with same'.

As semiconductor products become lighter, thinner, shorter, and smaller, in addition, the semiconductor unit such as the chipset mounted on the wafer becomes thinner.

If the semiconductor unit becomes thinner, it may be bent in a process of mounting it on the wafer to thus cause defects on contact points with the solder balls, thereby undesirably increasing the failure rate of the semiconductor product.

To prevent such defects from occurring, supports have to be additionally provided between the wafer and the semiconductor unit, but such addition makes the semiconductor product complicated in configuration, decreases the efficiency in the manufacturing process, and increases the failure rate of the semiconductor product.

Further, equipment for providing the supports has to be additionally prepared, which undesirably raises the manufacturing cost of the semiconductor product and causes low efficiencies even in operating and managing the equipment.

DISCLOSURE

Technical Problem

Accordingly, the present invention has been made in view of the above-mentioned problems occurring in the related art, and it is an object of the present invention to provide a dual-type solder ball placement system that is capable of allowing two ball mounting lines to operate cooperatively with each other, thereby mounting solder balls in various methods.

It is another object of the present invention to provide a dual-type solder ball placement system that is capable of allowing solder balls of the same type or solder balls having two different types to be mounted simultaneously through two ball mounting lines, thereby efficiently mounting the solder balls arranged with various purposes and patterns.

It is yet another object of the present invention to provide a dual-type solder ball placement system that is capable of allowing solder balls serving as terminals and core balls serving as supports to be mounted simultaneously through an inline method, thereby preventing a wafer, a unit, a chipset, and the like that become lighter, thinner, shorter, and smaller from being bent.

Technical Solution

To accomplish the above-mentioned objects, according to the present invention, there is provided a dual-type solder ball placement system including: a first ball mounting line for mounting first solder balls at set positions; and a second ball mounting line for mounting second solder balls at set positions if mounting the first solder balls is completed through the first ball mounting line.

Further, the first solder balls and the second solder balls may be different in at least one of their size, shape, structure, and characteristics.

In addition, the number of first solder balls may be smaller than the number of second solder balls, and otherwise, the mounted area of the first solder balls may be narrower than that of the second solder balls.

Moreover, the first solder balls may include core balls for serving as supports between a wafer and a chipset, and the second solder balls may serve as terminals between the wafer and the chipset.

Further, the first ball mounting line may include a first ball tool for picking up the first solder balls to mount the first solder balls on the set positions, and the second ball mounting line may include ball interference prevention grooves formed at portions corresponding to the mounted positions of the first solder balls and a second ball tool for picking up the second solder balls to mount the second solder balls on the set positions.

Advantageous Effects

According to the present invention, the dual-type solder ball placement system is configured to allow the two ball mounting lines to operate cooperatively with each other, thereby mounting the solder balls in various methods.

In specific, the dual-type solder ball placement system according to the present invention is configured to allow the solder balls having two different types to be mounted simultaneously through the two ball mounting lines.

As a result, the dual-type solder ball placement system can efficiently mount the solder balls arranged with various purposes and patterns.

In specific, the dual-type solder ball placement system is configured to allow the solder balls serving as terminals and the core balls serving as supports to be mounted simultaneously through the inline method.

As a result, the dual-type solder ball placement system can prevent the wafer, the unit, the chipset, and the like that become lighter, thinner, shorter, and smaller from being bent.

Under the development trend of the semiconductor products becoming lighter, thinner, shorter, and smaller, the dual-type solder ball placement system can accelerate the development of technologies in the semiconductor fields to thus produce superior quality products and improve product quality and price competitiveness.

In the case where the solder balls of the same type are mounted, in addition, the dual-type solder ball placement system can improve the mounting speeds of the solder balls through the dual-type mounting method, thereby improving the productivity and competitiveness even for existing products.

BEST MODE FOR INVENTION

Hereinafter, exemplary embodiments of a dual-type solder ball placement system according to the present invention will be described in detail with reference to the accompanying drawings.

Figure 1:
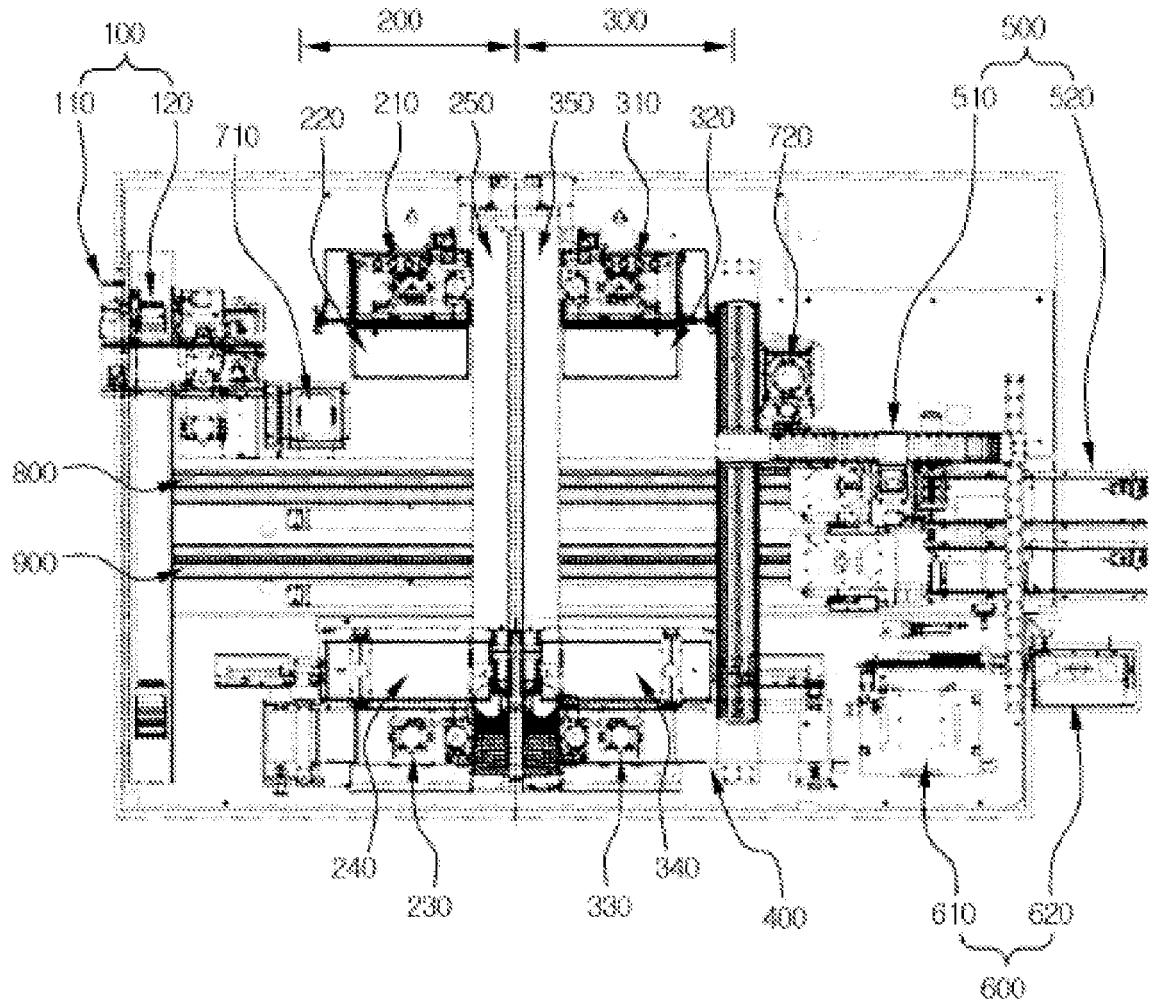
FIG. 1 is an exemplary view showing a configuration of a dual-type solder ball placement system according to the present invention.

FIG. 1 is an exemplary view showing a configuration of a dual-type solder ball placement system according to the present invention.

Referring to FIG. 1, a dual-type solder ball placement system according to the present invention includes an onloading unit 100, a first ball mounting line 200, a second ball mounting line 300, a flux cleaning unit 400, an offloading unit 500, and a rejecting unit 600.

The onloading unit 100 serves to supply an object material to which solder balls are mounted, such as a wafer, a wafer, a unit, a chipset, and the like and includes an onload conveyor 110 for receiving the object material from the outside and an onload picker 120 for picking up and conveying the received object material.

The first ball mounting line 200 serves to mount first solder balls at set positions of the object material and includes a first ball tool 210 for sucking the first solder balls, a first ball box 220 for storing the first solder balls, a first flux tool 230 for applying flux to the positions where the first solder balls are mounted, and a first flux box 240 for storing the flux. The first ball tool 210 of the first ball mounting line 200 moves along a first ball tool and flux tool rail 250, and the solder balls of the first ball box 220 are mounted on the object material conveyed through a first material transfer rail 800 or a second material transfer rail 900. The first flux tool 230 of the first ball mounting line 200 moves along the first ball tool and flux tool rail 250, and the flux of the first flux box 240 is applied to the object material conveyed through the first material transfer rail 800 or the second material transfer rail 900.

The second ball mounting line 300 serves to mount second solder balls at set positions of the object material and includes a second ball tool 310 for sucking the second solder balls, a second ball box 320 for storing the second solder balls, a second flux tool 330 for applying flux to the positions where the second solder balls are mounted, and a second flux box 340 for storing the flux. The second ball tool 310 of the second ball mounting line 300 moves along a second ball tool and flux tool rail 350, and the solder balls of the second ball box 320 are mounted on the object material conveyed through the first material transfer rail 800 or the second material transfer rail 900. The second flux tool 330 of the second ball mounting line 300 moves along the second ball tool and flux tool rail 350, and the flux of the second flux box 340 is applied to the object material conveyed through the first material transfer rail 800 or the second material transfer rail 900.

The first solder balls mounted by the first ball mounting line 200 and the second solder balls mounted by the second ball mounting line 300 are of the same type or have different types, as mentioned above.

If they have different types, they are different in at least one of their size, shape, structure, and characteristics.

If the first solder balls and the second solder balls having the same type as each other are used for one object material, first, the same solder balls are mounted simultaneously through the two ball mounting lines, thereby greatly improving the mounting speeds of the solder balls in the dual-type mounting method.

If it is desired to mount the first solder ball and the second solder ball having the same type as each other on the object material, the first ball mounting line 200 mounts the first solder balls on the object material conveyed along the first material transfer rail 800, while the second ball mounting line 300 mounts the second solder balls on the object material conveyed along the second material transfer rail 900, so that the solder balls can be mounted simultaneously through the two lines in the dual-type mounting method. Contrarily, the first ball mounting line 200 mounts the first solder balls on the object material conveyed along the second material transfer rail 900, while the second ball mounting line 300 mounts the second solder balls having the different type from the first solder balls on the object material conveyed along the first material transfer rail 800, so that the solder balls can be mounted simultaneously through the two lines in the dual-type mounting method.

If it is desired to mount the same solder balls on one object material but to mount the solder balls having different types according to object materials, the first ball mounting line 200 mounts the first solder balls on the object material conveyed along the first material transfer rail 800, while the second ball mounting line 300 mounts the second solder balls having the different type from the first solder balls on the object material conveyed along the second material transfer rail 900, so that the solder balls can be mounted simultaneously through the two lines in the dual-type mounting method. Contrarily, the first ball mounting line 200 mounts the first solder balls on the object material conveyed along the second material transfer rail 900, while the second ball mounting line 300 mounts the second solder balls having the different type from the first solder balls on the object material conveyed along the first material transfer rail 800, so that the solder balls can be mounted simultaneously through the two lines in the dual-type mounting method.

If it is desired to mount the solder balls having different types on one object material, the first ball mounting line 200 mounts the first solder balls on the object material conveyed along the first material transfer rail 800, while the second ball mounting line 300 mounts the second solder balls on the object material conveyed along the second material transfer rail 900 and having the first solder balls mounted by means of the first ball mounting line 200.

Contrarily, the first ball mounting line 200 is mounting the first solder balls on the object material conveyed along the second material transfer rail 900, while the second ball mounting line 300 mounts the second solder balls on the object material conveyed along the first material transfer rail 800 and having the first solder balls mounted through the first material transfer rail 800.

In specific, the first solder balls include core balls for serving as supports between the wafer and the chipset (or unit), and the second solder balls serve as terminals between the wafer and the chipset (or unit).

In this case, the core balls are configured to have nickel and solder layers formed on the outer peripheral surfaces of balls made of a metal material so as to stably support the space between the wafer and the chipset (or unit).

In addition thereto, the first solder balls and the second solder balls may be freely determined in configuration, and of course, they are the same as each other according to the request of a person having the skill in the art.

For example, the first ball mounting line 200 and the second ball mounting line 300 according to the present invention allow the solder balls mounted through the single line in the existing practices to be arranged dividedly from each other, thereby more improving the production speed of products than before.

In specific, the same solder balls are mounted simultaneously through the two lines, thereby greatly improving their mounting speeds.

In more specific, the first ball mounting line 200 mounts the solder balls on the object material conveyed along the first material transfer rail 800, while the second ball mounting line 300 mounts the solder balls on the object material conveyed along the second material transfer rail 900, so that the solder balls can be mounted simultaneously through the two lines in the dual-type mounting method and their mounting speeds can be greatly improved.

In the case where the first ball mounting line 200 and the second ball mounting line 300 mount the first solder balls and the second solder balls continuously by an inline method in the single system, the second solder balls have to be mounted in the state where the first solder balls are mounted, and accordingly, no interferences with the first solder balls mounted before the second solder balls have to occur in a process of mounting the second solder balls.

Figure 2:
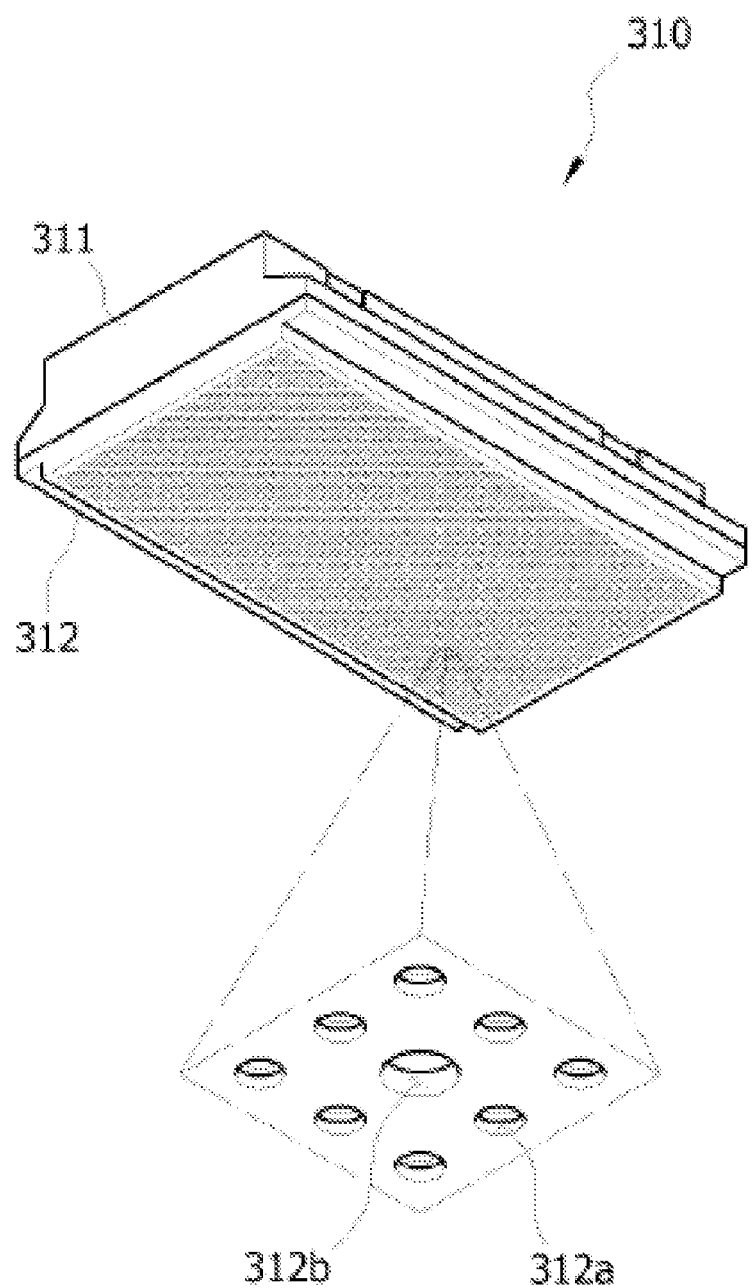
FIG. 2 is a perspective view showing a second ball tool of FIG. 1.

To do this, as shown in FIG. 2, the second ball tool 310 of the second ball mounting line 300 has ball interference prevention grooves 312b formed at the corresponding portions to the mounted positions of the first solder balls, which will be explained in detail later.

The second ball tool 310 has at least one or more ball interference prevention grooves 312b, and so as to effectively operate the first ball mounting line 200 and the second ball mounting line 300 cooperatively with each other, desirably, the number of portions where the first solder balls are located is smaller than the number of portions where the second solder balls are sucked, and otherwise, the mounted area of the first solder balls is narrower than that of the second solder balls.

For example, the first ball mounting line 200 mounts the core balls whose number is smaller than the number of second solder balls (or whose mounted area is narrower than that of the second solder balls), and the second ball mounting line 300 has the ball interference prevention grooves 312b formed only at the portions where the core balls are located, so that the core balls and the solder balls can be mounted more effectively.

The flux cleaning unit 400 serves to remove the flux remaining in the first flux tool 230 and the second flux tool 330, and the flux cleaning unit 400 may be freely changed in configuration according to the structural characteristics of the flux tools and the request of a person having the skill in the art, without being limited to a specific configuration.

The offloading unit 500 serves to transfer the object material on which the first solder balls and the second solder balls are normally mounted for a next process and includes an offload picker 510 for conveying the object material on which the solder balls are mounted to a tray and an offload conveyor 520 for transferring the tray.

The rejecting unit 600 serves to collect the object material on which at least one of the first solder balls and the second solder balls is abnormally mounted and includes a reject tray stage 610 for loading reject trays on which abnormal object materials are collected and a reject elevator 620 for collecting the reject trays. In this case, the collection of the abnormal object materials on the reject trays is performed by the offload picker 510 of the offloading unit 500.

Further, the dual-type solder ball placement system according to the present invention includes a look-up vision device 710 and a vision inspection device 720 for inspecting the solder balls mounted so as to determine whether the object material on which the first solder balls and the second solder balls are mounted is normally transferred through the offload picker 510 of the offloading unit 500 or collected through the rejecting unit 600.

The look-up vision device 710 performs the vision inspection for the first solder balls, and the vision inspection device 720 for the second solder balls. In this case, the solder ball mounting and the solder ball vision inspection may be performed freely in order according to the request of a person having the skill in the art.

For example, the vision inspection for the first solder balls is performed after the first solder balls have been mounted, and the vision inspection for the second solder balls is performed after the second solder balls have been mounted. Otherwise, the vision inspection for the first solder balls and the vision inspection for the second solder balls are performed simultaneously after the first solder balls and the second solder balls have been mounted.

FIG. 2 is a perspective view showing the second ball tool of FIG. 1.

Referring to FIG. 2, the second ball tool 310 includes a tool body 311 and a tool cover 312.

The tool body 311 has a plurality of negative pressure lines formed thereon to suck the solder balls. In this case, the negative pressure lines and the configuration and method for forming negative pressure on the negative pressure lines may be freely provided according to the request of a person having the skill in the art, without being limited particularly thereto.

The tool cover 312 is coupled to the underside of the tool body 311 and has a plurality of sucking holes 312a penetrated thereinto and connected spatially to the negative pressure lines.

Further, the tool cover 312 has the ball interference prevention grooves 312b formed on the underside thereof to insert the core balls as the first solder balls mounted before the second solder balls at the time when the second solder balls are mounted.

In this case, each ball interference prevention groove 312b has a given size capable of having no contact with the core ball.

Further, as mentioned above, on the entire underside of the tool cover 312, an area having the ball interference prevention grooves 312b is desirably narrower than an area where the sucking holes 312a are formed.

Figure 3A:
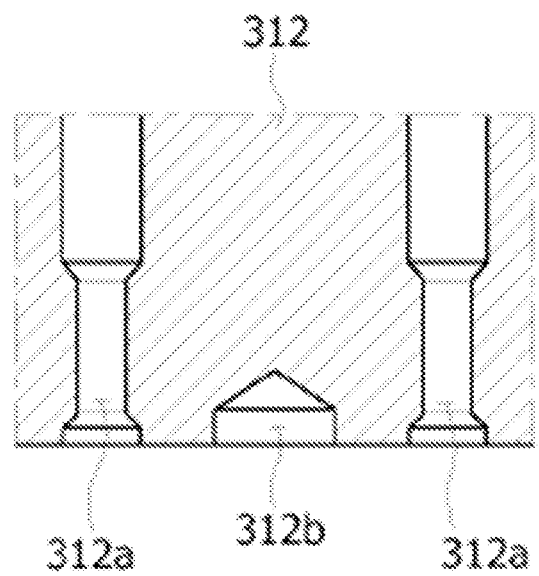
FIGS. 3a and 3b are partially enlarged sectional views showing examples of a ball interference prevention groove of FIG. 2.
Figure 3B:
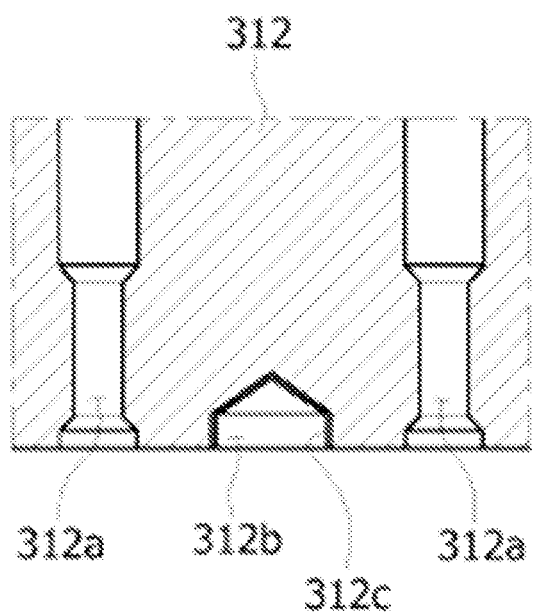

FIGS. 3a and 3b are partially enlarged sectional views showing examples of the ball interference prevention groove of FIG. 2.

Referring to FIGS. 3a and 3b, the ball interference prevention groove 312b is formed by extending a conical space portion inwardly from a cylindrical space portion.

Figure 4:
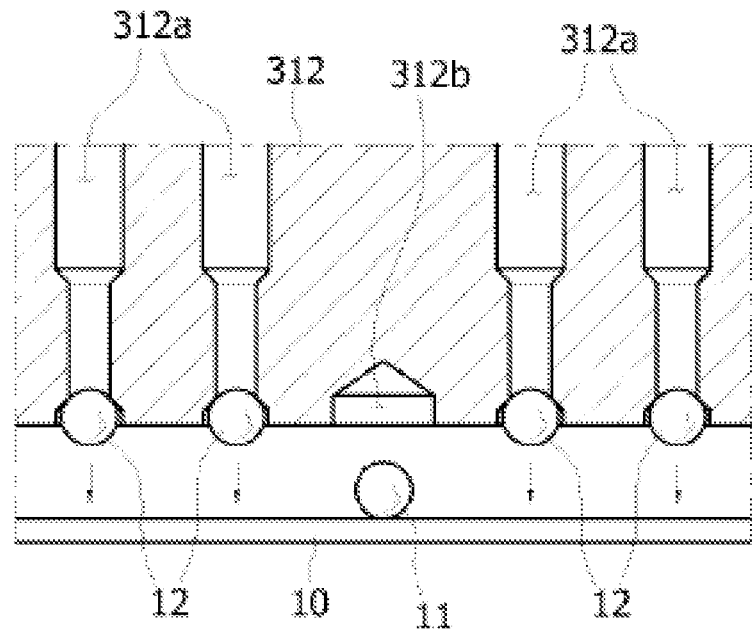
FIG. 4 is a sectional view showing the function of the ball interference prevention groove of FIG. 2.
Figure 4:
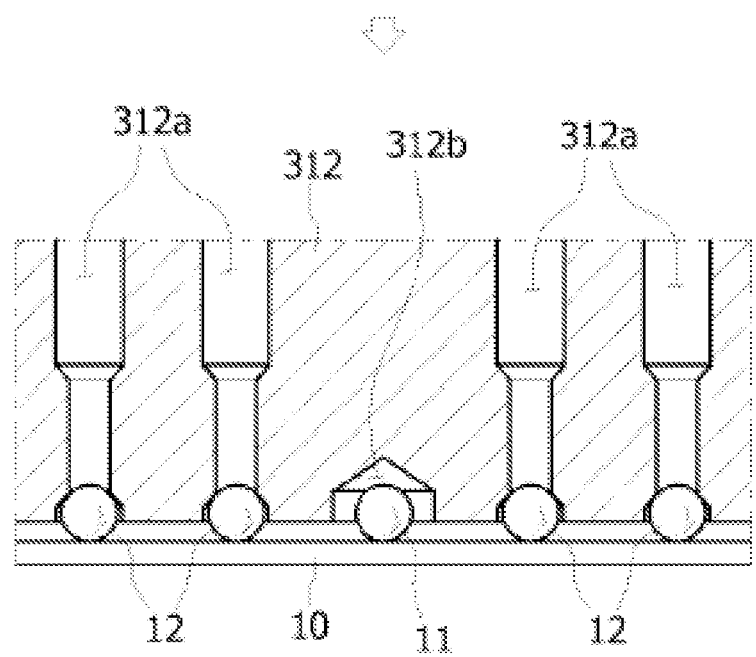

As shown in FIG. 3a, if the ball interference prevention groove 312b has the shape of the space portion obtained by combining the cylindrical space portion and the conical space portion, an interference with the core ball can be avoided with the minimal space in a state where the core ball (the first solder ball) is introduced thereinto, as shown in FIG. 4, so that the machining volume of the ball interference prevention groove 312b can be minimized.

As semiconductor products become lighter, thinner, shorter, and smaller, further, the solder balls become small in size, and in the case of the solder balls with a given size or under, the solder balls may be unnecessarily attached to the underside of the tool cover 312.

As the solder balls become small in size, a force with small intensity (that is a magnetic force such as electrostatic phenomenon), which is negligible in the case of the solder balls with relatively large sizes, appears, and if the force is generated from the ball interference prevention groove 312b, the mounted core ball may be demounted from the ball interference prevention groove 312b, thereby undesirably causing a defect.

To prevent such a phenomenon from occurring, as shown in FIG. 3b, a shielding layer 312c is formed on the inner peripheral surface of the ball interference prevention groove 312b to prevent static electricity from being generated from the ball interference prevention groove 312b.

Accordingly, the second ball tool 310 minimizes the physical interferences with the first solder balls (core balls) mounted before the second solder balls and the non-physical interferences with the first solder balls, such as the magnetic force, and the like.

FIG. 4 shows the function of the ball interference prevention groove of FIG. 2.

If the object material 10 on which the core ball 11 is mounted through the first ball mounting line 200 is located, first, the second ball tool 310 of the second ball mounting line 300 allows the core ball 11 to be located inside the ball interference prevention groove 312b in the state of sucking the solder balls 12, and next, the second ball tool 310 mounts the solder balls 12 on the object material 10.

Accordingly, the second ball mounting line 300 mounts the solder balls 12 at desired positions in the state where the interference with the core ball 11 mounted before the solder balls 12 is avoided.

Further, the dual-type solder ball placement system according to the present invention mounts the core balls 11 and the solder balls 12 sequentially on the object material 10 in the state where the flux is applied to the object material 10. However, of course, the core balls 11 may be mounted after the flux for the core balls 11 has been applied, and if mounting the core balls 11 is completed, the solder balls 12 may be mounted after the flux for the solder balls 12 has been applied.

According to the present invention, the ball interference prevention grooves 312b formed on the second ball tool 310 may be further formed on the underside of the second flux tool 330 if necessary according to the functions and structures of the second flux tool 330 of the second ball mounting line 300.

Figure 5A:
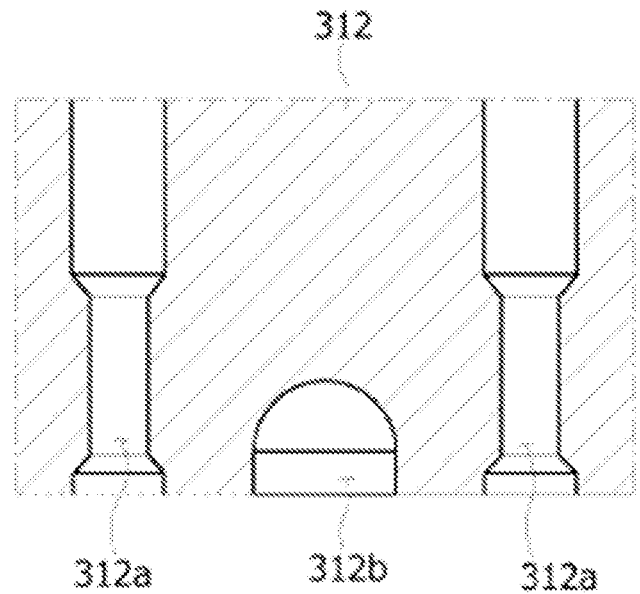
FIGS. 5a and 5b are partially enlarged sectional views showing other examples of the ball interference prevention groove of FIGS. 3a and 3b.
Figure 5B:
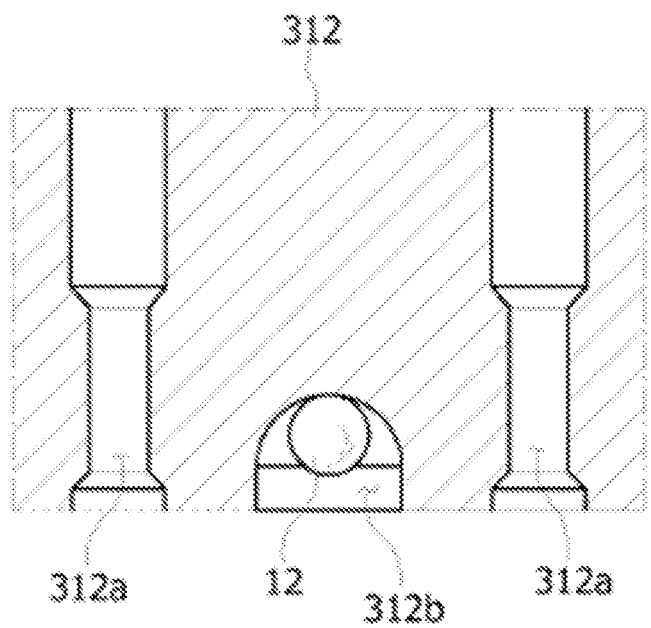

FIGS. 5a and 5b show other examples of the ball interference prevention groove of FIGS. 3a and 3b.

Referring to FIGS. 5a and 5b, the ball interference prevention groove 312b is formed on the underside of the tool cover 312 by extending a curved space portion inwardly from a cylindrical space portion. In this case, the curved space portion is hemispherical.

For example, the solder ball 12 may be introduced into the ball interference prevention groove 312b in a process where the solder balls 12 stored in the ball boxes 220 and 320 are picked up through the ball tools 210 and 310 during the solder ball mounting process.

In this case, if the ball interference prevention groove 312b is formed by extending the conical space portion inwardly from the cylindrical space portion, as shown in FIGS. 3a and 3b, the conical space portion has line contacts with the solder ball 12 so that the contacted portions with the solder ball 12 become increased to cause the solder ball 12 introduced into the ball interference prevention groove 312b to stay inside the ball interference prevention groove 312b, not to be detached from the ball interference prevention groove 312b.

Accordingly, the interference with the core ball 11 occurs in the next process of mounting the solder balls 12, which causes defects in process.

Contrarily, if the ball interference prevention groove 312b is formed by extending the curved (hemispherical) space portion inwardly from the cylindrical space portion, as shown in FIGS. 5a and 5b, the ball interference prevention groove 312b has point contacts with the solder ball 12 introduced thereinto, so that there are few possibilities that an escaping or scattering solder ball 12 is caught to the ball interference prevention groove 312b, and further, the solder ball 12 is easily detached from the ball interference prevention groove 312b.

Accordingly, the reliability in the process of mounting the solder balls 12 is improved, and the yield and quality of the product are greatly enhanced.

While the dual-type solder ball placement system according to the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

The foregoing description of the embodiments of the invention has been presented for the purpose of illustration; it is not intended to be exhaustive or to limit the invention to the precise forms disclosed.

EXPLANATIONS OF REFERENCE NUMERALS

100: Onloading unit
200: First ball mounting line
210: First ball tool 220: First ball box
230: First flux tool 240: First flux box
300: Second ball mounting line
310: Second ball tool 320: Second ball box 330: Second flux tool 340: Second flux box
400: Flux cleaning unit
500: Offloading unit
600: Rejecting unit
710: Look-up vision device
720: Vision inspection device

INDUSTRIAL APPLICABILITY

The present invention is applicable to semiconductor fields, semiconductor package manufacturing fields, PCB manufacturing fields, particularly wafer level chip scale package (WLCSP)-based manufacturing fields, solder ball placement system fields, and other fields similar or related thereto.

The invention claimed is:

1. A dual-type solder ball placement system comprising:
a first ball mounting line configured to mount first solder balls at first set positions; and
a second ball mounting line configured to mount second solder balls at second set positions,
wherein the first ball mounting line comprises:
a first ball box configured to store the first solder balls;
a first ball tool configured to suck the first solder balls from the first ball box to mount the first solder balls at the first set positions;
a first flux box configured to store first flux; and
a first flux tool configured to apply the first flux to the first set positions where the first solder balls are mounted, and
the second ball mounting line comprises:
a second ball box configured to store the second solder balls;
a second ball tool configured to suck the second solder balls from the second ball box to mount the second solder balls at the second set positions;
a second flux box configured to store second flux; and
a second flux tool configured to apply the second flux to the second set positions where the second solder balls are mounted,
wherein the first flux tool is configured to move along a rail to apply the first flux of the first flux box to an object material conveyed through a first material transfer rail or a second material transfer rail,
wherein the first ball tool of the first ball mounting line is configured to move along the first rail to mount the first solder balls of the first ball box on the object material conveyed through the first material transfer rail or the second material transfer rail,
wherein the second flux tool is configured to move along a second rail to apply the second flux of the second flux box to the object material conveyed through the first material transfer rail or the second material transfer rail,
wherein the second ball tool of the second ball mounting line is configured to move along the second rail to mount the second solder balls of the second ball box on the object material conveyed through the first material transfer rail or the second material transfer rail,
wherein, in a case in which the first solder balls and the second solder balls of a same type are mounted on object materials, the first ball mounting line is configured to mount the first solder balls on the object material conveyed along one of the first material transfer rail and the second material transfer rail, while the second ball mounting line is configured to mount the second solder balls on the object material conveyed along the other of the first material transfer rail and the second material transfer rail, and
wherein, in a case in which the first solder balls and the second solder balls having different types are mounted on one object material, the first ball mounting line is configured to mount the first solder balls on the object material conveyed along one of the first material transfer rail and the second material transfer rail, while the second ball mounting line is configured to mount the second solder balls on the object material conveyed along the other of the first material transfer rail and the second material transfer rail, the object material conveyed along the other of the first material transfer rail and the second material transfer rail having the first solder balls mounted thereon through the first ball mounting line.

2. The dual-type solder ball placement system according to claim 1,
wherein, in a case in which the first solder balls are mounted onto one object material and the second solder balls having a type different from the first solder balls are mounted onto another object material, the first ball mounting line is configured to mount the first solder balls on the object material conveyed along one of the first material transfer rail and the second material transfer rail, while the second ball mounting line is configured to mount the second solder balls having the type different from the first solder balls on the object material conveyed along the other of the first material transfer rail and the second material transfer rail.

3. The dual-type solder ball placement system according to claim 1,
wherein the second ball tool has ball interference prevention grooves defined at portions corresponding to the first set positions of the first solder balls, and each of the ball interference prevention grooves has a hemispherical surface defined on an inside thereof.

4. The dual-type solder ball placement system according to claim 1,
wherein the first solder balls and the second solder balls have different sizes or shapes.

5. The dual-type solder ball placement system according to claim 1,
wherein the first solder balls comprise core balls configured to serve as supports between a wafer and a chipset, and the second solder balls are configured to serve as terminals between the wafer and the chipset.

* * * * *